(12) United States Patent
Chang et al.

(10) Patent No.: US 10,818,611 B2
(45) Date of Patent: Oct. 27, 2020

(54) STRESS RELIEF IN SEMICONDUCTOR WAFERS

(71) Applicant: II-VI OptoElectronic Devices, Inc., Warren, NJ (US)

(72) Inventors: Kevin Chi-Wen Chang, Princeton Junction, NJ (US); David Hensley, Fanwood, NJ (US); William Wilkinson, Easton, PA (US)

(73) Assignee: II-VI Delaware, Inc., Wilmington, DE (US)

( * ) Notice: Subject to any disclaimer, the term of this patent is extended or adjusted under 35 U.S.C. 154(b) by 381 days.

(21) Appl. No.: 15/438,322

(22) Filed: Feb. 21, 2017

(65) Prior Publication Data

US 2017/0162522 A1 Jun. 8, 2017

Related U.S. Application Data

(63) Continuation-in-part of application No. 15/253,373, filed on Aug. 31, 2016, now abandoned.

(Continued)

(51) Int. Cl.
*H01L 23/00* (2006.01)
*H01L 21/02* (2006.01)
(Continued)

(52) U.S. Cl.
CPC ............ *H01L 23/562* (2013.01); *C23C 16/06* (2013.01); *C23C 16/345* (2013.01); *C23C 16/402* (2013.01); *C23C 16/513* (2013.01); *C30B 33/00* (2013.01); *H01L 21/022* (2013.01); *H01L 21/0217* (2013.01); *H01L 21/02164* (2013.01); *H01L 21/02175* (2013.01);

(Continued)

(58) Field of Classification Search
CPC ............ H01L 23/562; H01L 21/02505; H01L 21/02513; H01L 21/022; H01L 21/02164; H01L 21/0217; H01L 21/02186; H01L 21/02183; H01L 21/02178; H01L 21/02175; H01L 21/02274; H01L 21/02362; H01L 22/20; H01L 23/3192; H01L 23/3171; H01L 23/29; H01L 22/12; C30B 33/00; C23C 16/345; C23C 16/402; C23C 16/06; C23C 16/513; H01S 5/0216; H01S 5/183; H01S 2301/17

See application file for complete search history.

(56) References Cited

U.S. PATENT DOCUMENTS

| 4,769,689 A | 9/1988 | Lin |
| 5,952,679 A | 9/1999 | Kitou |

(Continued)

OTHER PUBLICATIONS

Zhou, Delai et al.; "Progress on vertical-cavity surface-emitting laser arrays for infrared illumination applications", Proc. SPIE 9001, Vertical-Cavity Surface-Emitting Lasers XVIII, 90010E, (Feb. 27, 2014).

(Continued)

*Primary Examiner* — Benjamin Tzu-Hung Liu
(74) *Attorney, Agent, or Firm* — Wendy W. Koba

(57) ABSTRACT

Methods for compensating for bow in a semiconductor structure comprising an epitaxial layer grown on a semiconductor substrate. The methods include forming an adhesion layer on the backside of the wafer, and forming a stress compensation layer on the adhesion layer.

20 Claims, 4 Drawing Sheets

Related U.S. Application Data

(60) Provisional application No. 62/187,752, filed on Jul. 1, 2015.

(51) Int. Cl.
| | |
|---|---|
| *H01L 21/66* | (2006.01) |
| *H01L 23/31* | (2006.01) |
| *H01L 23/29* | (2006.01) |
| *C30B 33/00* | (2006.01) |
| *C23C 16/34* | (2006.01) |
| *C23C 16/40* | (2006.01) |
| *C23C 16/06* | (2006.01) |
| *C23C 16/513* | (2006.01) |
| *H01S 5/02* | (2006.01) |
| *H01S 5/183* | (2006.01) |

(52) U.S. Cl.
CPC .. *H01L 21/02178* (2013.01); *H01L 21/02183* (2013.01); *H01L 21/02186* (2013.01); *H01L 21/02274* (2013.01); *H01L 21/02362* (2013.01); *H01L 21/02505* (2013.01); *H01L 21/02513* (2013.01); *H01L 22/20* (2013.01); *H01L 23/29* (2013.01); *H01L 23/3171* (2013.01); *H01L 23/3192* (2013.01); *H01S 5/0216* (2013.01); *H01S 5/183* (2013.01)

(56) References Cited

U.S. PATENT DOCUMENTS

| | | | |
|---|---|---|---|
| 6,770,504 B2* | 8/2004 | Horning | B81C 1/00666 |
| | | | 438/48 |
| 6,808,952 B1 | 10/2004 | Sniegowski et al. | |
| 6,865,308 B1 | 3/2005 | Conway et al. | |
| 8,093,143 B2 | 1/2012 | Storck et al. | |
| 8,723,296 B2 | 5/2014 | Ramdani | |
| 2003/0033974 A1 | 2/2003 | Ueda | |
| 2013/0146863 A1 | 6/2013 | Ramdani | |
| 2014/0048848 A1* | 2/2014 | Storck | H01L 21/0245 |
| | | | 257/190 |
| 2015/0035123 A1 | 2/2015 | Bayram et al. | |
| 2015/0255955 A1* | 9/2015 | Wang | H01S 5/0224 |
| | | | 438/29 |
| 2015/0294917 A1 | 10/2015 | deVilliers | |
| 2015/0340225 A1* | 11/2015 | Kim | H01L 21/67069 |
| | | | 438/694 |
| 2016/0035682 A1 | 2/2016 | Chen | |

OTHER PUBLICATIONS

Bristow, Thomas, "Wafer Thickness TTV Bow and Warp for Thin Wafer Application for SEMATECH Workshop on 3D Interconnect Metrology", Jul. 11, 2012, Chapman Instruments.

* cited by examiner

STRESS RELIEF IN SEMICONDUCTOR WAFERS

CROSS-REFERENCE TO RELATED APPLICATIONS

This application is a continuation-in-part of U.S. application Ser. No. 15/253,373, filed Aug. 31, 2016, which claims the benefit of U.S. Provisional Patent Application No. 62/187,752, filed Jul. 1, 2015, the entire contents of both applications being incorporated herein by reference.

BACKGROUND

Semiconductor device fabrication often involves the deposition of a stack of layers on an underlying wafer substrate. In most cases, one layer after another is formed (typically "deposited") on a front face surface of the wafer. The wafer itself may have a diameter of at least three inches, ranging upwards to twelve inches for some fabrication processes. As the deposited layers build up on the wafer, they can introduce stress onto the wafer, causing the wafer to bow. The bow can be attributed to factors such as differences in layer composition, temperature fluctuations during deposition, etc.

Wafer bow can make it difficult, if not impossible, to process the wafer in automated machinery, can move the surface of the wafer out of the image plane required in certain optical processes, and is generally undesirable. As wafer sizes increase, these problems are exacerbated.

One type of semiconductor device that has a significant wafer bow problem is a vertical cavity surface emitting laser (VCSEL). VCSELs are typically formed by growing a large number of epitaxial layers of a semiconductor material on the surface of a semiconductor wafer. Small differences between the structure of the epitaxial layers and the underlying wafer create stresses that tend to bow the wafer. All the usual problems in processing bowed semiconductor wafers can result.

SUMMARY

The present invention relates to a method of compensating for bow in a semiconductor wafer. The method includes the steps of obtaining a semiconductor wafer including an epitaxial layer formed on a top major surface of a semiconductor substrate (where the presence of the epitaxial layer causes the wafer to bow), applying an adhesion layer across an exposed major surface of the semiconductor wafer, and depositing a stress compensation layer over the adhesion layer. The stress compensation layer exhibits a high stress state and is formed to a thickness sufficient to substantially reduce the amount of wafer bow.

In another embodiment, the present invention relates to a bow-compensated semiconductor wafer comprising a substrate of a semiconductor material with an epitaxial layer formed over a major surface of the substrate (the combination of the substrate and epitaxial layer creating a bow across the wafer surface). The bow-compensated wafer also includes an adhesion layer formed on an exposed major surface of the semiconductor wafer and a stress compensation layer formed on the adhesion layer. The stress compensation layer exhibits a high stress state and is formed to a thickness sufficient to reduce the created wafer bow.

DETAILED DESCRIPTION

Figure 1A:
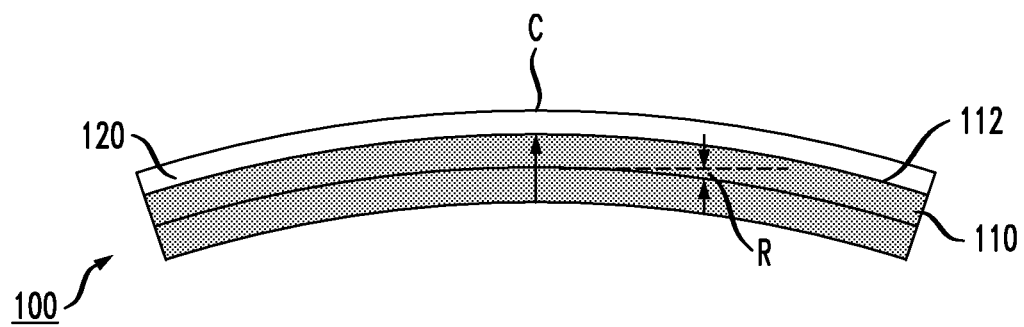
FIGS. 1A and 1B are a side view and a top view of a bowed semiconductor wafer.

The present invention addresses various concerns regarding wafer bow and relates to a method and structure for compensation of wafer bow that takes the form of a bi-layer bow compensation structure that is deposited on an exposed major surface of a semiconductor wafer. The semiconductor wafer as supplied by a vendor typically includes a layer of epitaxial material grown on a top major surface of the semiconductor wafer. The slight difference in crystallographic structure between the wafer and the epitaxial layer is known to cause the wafer to bow. The bi-layer bow compensation structure is deposited reduce this wafer bow and thus provide a highly planar epitaxial surface upon which the various device layers may subsequently be formed.

In accordance with the present invention, the bi-layer bow compensation structure comprises a first, relatively thin, adhesion layer disposed to coat an exposed major surface of the wafer (e.g., the exposed surface of the epitaxial layer, the bottom major surface of the substrate). A high stress compensation layer is then formed over the adhesion layer. The material composition of the high stress compensation layer, as well as its thickness, is controlled so as to properly compensate for the amount of bow present in a given wafer.

The adhesion layer may comprise a dielectric material such as, for example, silicon nitride or silicon dioxide, or may comprise a metal such as titanium, titanium nitride, tantalum, aluminum, or gold. The adhesion layer is deposited at a temperature sufficient provide the requisite degree of affixation to the wafer without compounding the stress condition of the wafer itself. The adhesion layer is utilized to create a surface morphology that is suitable for the following deposition of the high stress compensation layer, functioning as the "glue" that bonds the compensation layer to the wafer in a manner such that the forces associated with wafer bow are mitigated.

The stress compensation layer is formed to exhibit a stress of like kind as presently experienced by the wafer to which it is being attached. That is, a wafer experiencing tensile stress will have a stress compensation layer deposited on the adhesion layer that exhibits the same (or nearly the same) degree of tensile stress. Likewise, a wafer experience compressive stress will be processed to include a stress compensation layer that also has a compressive stress state.

In most embodiments, the bi-layer stress compensation structure takes the form of sacrificial layers that are removed from the wafer immediately prior to slicing/sawing the wafer into individual devices.

In a first illustrative embodiment, warpage in a semiconductor structure comprising an epitaxial layer grown on a semiconductor substrate is compensated for by forming an adhesion layer on the epitaxial layer and forming a compensating layer on the adhesion layer. The compensating layer stresses the wafer in opposition to the stresses imposed by the epitaxial layer, thereby reducing the warpage in the wafer.

In a second illustrative embodiment, warpage in a semiconductor structure comprising an epitaxial layer grown on a semiconductor substrate is compensated for by forming an adhesion layer on the backside of the substrate (i.e., the bottom major surface), opposite to the surface upon which the epitaxial layer is grown and forming a compensating layer on the adhesion layer. The compensating layer stresses the wafer in opposition to the stresses imposed by the epitaxial layer, thereby reducing the warpage in the wafer.

In a third illustrative embodiment, warpage in a semiconductor structure comprising an epitaxial layer grown on a semiconductor substrate is compensated for by forming grooves in the epitaxial layer. The grooves relieve the stresses created by the epitaxial layer, thereby reducing the warpage in the wafer.

Figure 1B:
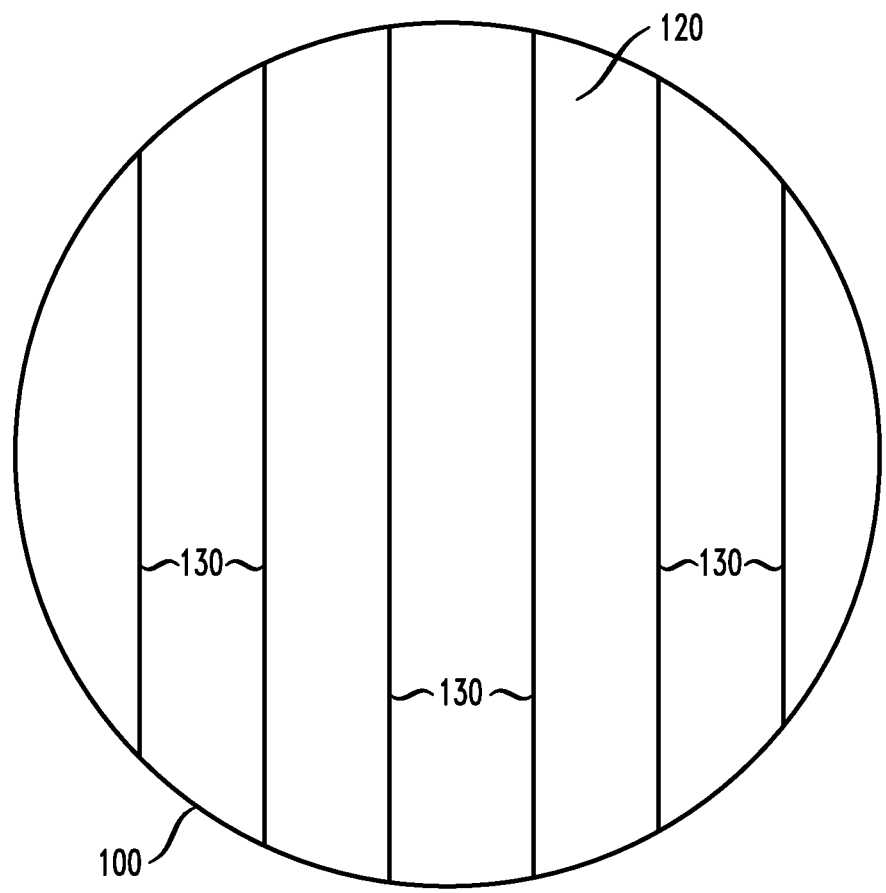

FIGS. 1A and 1B depict a bowed semiconductor wafer 100 comprising a semiconductor substrate 110, with an epitaxial layer 120 grown on a top major surface 112 of substrate 110. Epitaxial layer 120 may be the same semiconductor material as that of substrate 110. The invention may be practiced with any type of semiconductor material. Illustrative examples include silicon, germanium, silicon germanium, silicon carbide, gallium arsenide, gallium nitride, and numerous other semiconductors including binary, tertiary and quaternary compounds.

Because of slight differences in the crystalline structure of the epitaxial layer and that of the substrate, the wafer is stressed causing it to bow. In this case a substantial bow is developed as is apparent in the side view of FIG. 1A. If measures are not taken to address the bow problem at this point in time, misalignment problems and additional wafer perturbations will continue during the fabrication process, significantly reducing the yield of acceptable devices from the bowed wafer (to the point where the entire wafer may need to be discarded). This bow is corrected by the methodology of the present invention as shown in the exemplary embodiments of FIGS. 2-4.

FIG. 1B is a top view of wafer 100 with several contour lines 130 depicting points having the same deviation above or below a reference plane. The bow of a wafer is typically characterized in terms of the deviation of the center point of the median surface of a free, un-clamped wafer from the median surface of the reference plane, the center point denoted as "C" in FIG. 1A, with the reference plane denoted as "R" in FIG. 1A. While the view shown in FIG. 1B is exemplary for one-dimensional bowing (that is, the vertical lines defining one-dimensional bow as convex, concave, or saddle-shaped compound bowing), It is to be understood that semiconductor wafers may also exhibit two-dimensional bowing. In this case, the contour lines would take the form of circles (or ovals), associated with a bowl-shaped type of contour. Thus, for the purposes of the present invention, it is to be understood that the proposed solution is suitable for use with semiconductor wafers exhibiting either one-dimensional or two-dimensional bowing.

Figure 2:
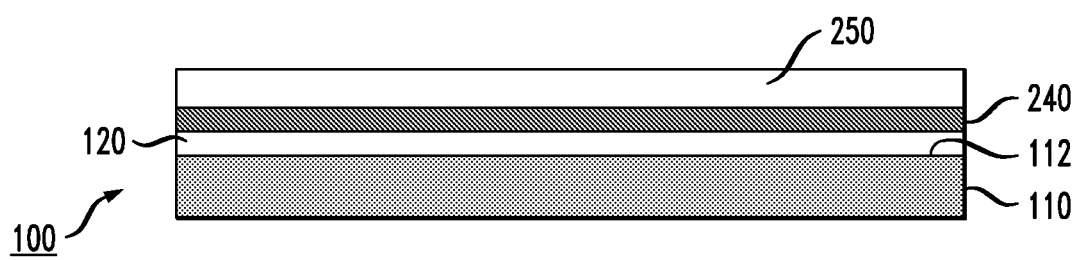
FIG. 2 depicts a first illustrative embodiment of the present invention.

In accordance with a first illustrative embodiment of the invention, the warpage in wafer 100 is compensated for by forming an adhesion layer 240 on epitaxial layer 120 and forming a compensating layer 250 on the adhesion layer as shown in FIG. 2 (layers not drawn to scale relative to one another). Adhesion layer 240 provides bonding between epitaxial layer 120 and compensating layer 250. Compensating layer 250 stresses the wafer in opposition to the stresses imposed by epitaxial layer 120, thereby reducing the warpage in the wafer as shown in FIG. 2. Illustratively, epitaxial layer 120 has compressive stress and compensating layer 250 has tensile stress. Alternatively, epitaxial layer 120 may have tensile stress and compensating layer 250 has compressive stress.

Figure 3:
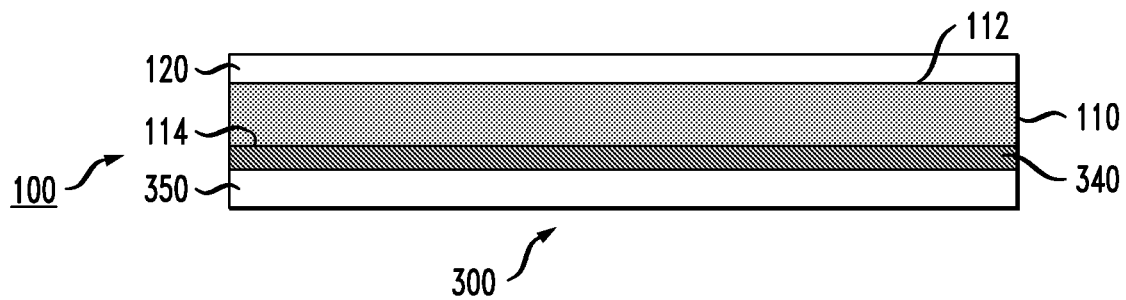
FIG. 3 depicts a second illustrative embodiment of the invention.

In accordance with a second illustrative embodiment of the invention as shown in FIG. 3, the warpage in wafer 100 is compensated for by forming a bi-layer compensation structure 300 on a second major surface 114 (i.e., the "backside" surface) of substrate 110. As shown, bi-layer compensation structure 300 comprises an adhesion layer 340 deposited on the exposed, second major surface 114 of substrate 110 and a high stress compensation layer 350 formed on adhesion layer 340. In accordance with this second illustrative embodiment of the present invention, bi-layer compensation structure 300 is formed on second major surface 114 of substrate 110 opposite of first major surface 112 (upon which epitaxial layer 120 is grown).

Layer 340 is utilized to provide bonding between surface 114 of substrate 110 and high stress compensation layer 350. Adhesion layer 340 may be formed of a dielectric material (e.g., $SiO_2$, SiN, or the like) which is deposited to a thickness of less than about 0.5 µm (preferably, in the range of 0.1-0.2 µm). Alternatively, adhesion layer 340 may be formed of a metal (e.g., titanium, titanium nitride, tungsten) which is deposited to a thickness in the range of about 200-500 Å (0.02-0.05 µm). Adhesion layer 340 functions to transfer the stress created by the addition of underlying stress compensation layer 350 to substrate 110 (thus compensation for the initial stress associated with the presence of epitaxial layer 120), while also bonding compensation layer 350 to substrate 110 for the remainder of the fabrication process.

High stress compensation layer 350 stresses the wafer in opposition to the stresses imposed by epitaxial layer 120, thereby reducing the bow in the wafer as shown in FIG. 3. Illustratively, both epitaxial layer 120 and high stress compensation layer 350 exhibit compressive stress, or both layers exhibit tensile stress. In particular and as discussed in more detail below, layer 350 is formed to exhibit high stress by varying one or more of the parameters controlling its deposition (e.g., deposition temperature, deposition pressure, reactant flow rates, reactant flow compositions, and the like).

In accordance with the embodiment of the present invention as shown in FIG. 3, adhesion layer 340 is selected to exhibit relatively little stress, and is not intended to significantly alter the stress state of the bowed wafer. Preferably, adhesion layer 340 is deposited using a relatively high temperature process (e.g., in the range of 400-430° C.) so as to ensure that the adhesive qualities are not impacted during subsequent fabrication processing (i.e., so that compensation layer 350 does not "peel off" during the remaining steps of the device fabrication process). However, care must be taken when using a metal as the adhesion layer, since it is possible for mobile ions to migrate from the metal into the wafer itself if the deposition temperature is too high.

Once adhesion layer 340 is created, the process of this embodiment of the present invention continues by depositing high stress compensation layer 350 onto adhesion layer 340. In accordance with the present invention, the utilization of adhesion layer 340 allows for layer 350 to be deposited via a process that efficiently and effectively generates a level of stress that will compensate for the wafer bow. A plasma CVD (PCVD) process may be used to deposit high stress compensation layer 350 onto adhesion layer 340, where the various parameters associated with this type of deposition process (e.g., reactor temperature, reactor pressure, plasma temperature, precursor flow rates and compositions, etc.) may be variably adjusted in situ to impart the required stress state to the deposited material. Without the inclusion of adhesion layer 340, it would be difficult to directly deposit a PCVD layer directly on an exposed wafer surface.

High stress compensation layer 350 may be formed of the same material as adhesion layer 340 or, alternatively, a different material may be used. If the same material is used, different deposition conditions are utilized to control the specific qualities of each layer (i.e., forming layer 340 to adhere to wafer 100; forming layer 350 to exhibit high stress that compensates for wafer bow).

When using a plasma CVD process to deposit high stress compensation layer 350, various and selected ones of the process parameters can be controlled (and adjusted) to impart the desired degree of stress in the deposited material. Parameters such as, but not limited to, the flow rates of the precursors (e.g., silane, nitrous oxide), selection of precursor sources, reactor temperature and/or pressure, plasma temperature, and the like, are controlled to create the amount of stress (either tensile or compressive) that is desired in order to match the stress present in the wafer itself. The plasma CVD process is particularly useful in forming high stress compensation layers of silicon dioxide or silicon nitride. Other processes, such as sputtering or, alternatively, plasma-enhanced CVD, may be used to create a stress compensation layer 350. A PECVD process may be preferred when compensation layer 350 comprises a metal or metallic compound (e.g., titanium, tungsten, nickel, aluminum, tantalum, or alloys thereof). Preferably, stress compensation 350 is deposited at a temperature comparable to those associated with subsequent processing steps, ensuring that the stress accommodation properties of layer 350 are not compromised during the fabrication process.

Figure 4:
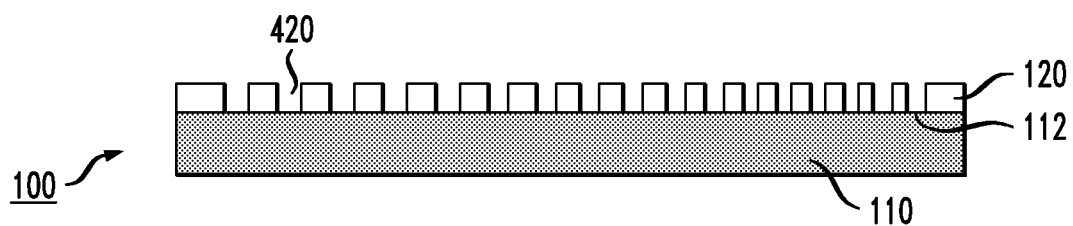
FIG. 4 depicts a third illustrative embodiment of the invention.

In accordance with a third illustrative embodiment of the invention, the warpage is compensated for by forming grooves 420 in epitaxial layer 120. The grooves relieve the stresses created by the epitaxial layer, thereby reducing the warpage in the wafer as shown in FIG. 4. In some embodiments, grooves 420 may be formed in epitaxial layer 120 along the lines where the wafer will subsequently be scribed so as to separate (or singulate) the wafer into separate semiconductor devices. In other embodiments, grooves 420 may be formed substantially parallel to some of contour lines representing constant deviation of the surface of the wafer from a reference plane. Alternatively, in situations where two-dimensional bowing is present, grooves 420 may also be formed in a two-dimensional pattern (e.g., concentric circles) to compensate for this type of stress pattern. Optionally, the grooves may be combined with the structures of FIG. 2 or 3.

Figure 5:
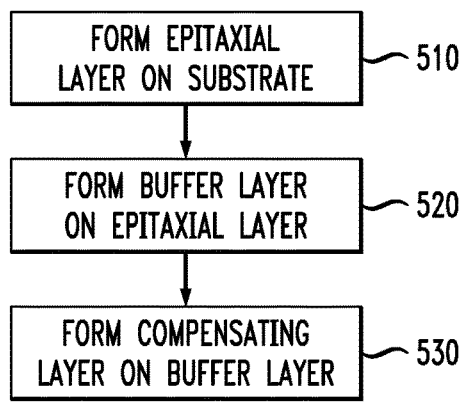
FIG. 5 is a flow chart depicting an illustrative method for practicing the invention.

FIG. 5 is a flow chart depicting an illustrative method for practicing the invention. At step 510, an epitaxial layer is formed on a first major surface of a semiconductor wafer. At step 520, a buffer layer is formed on the epitaxial layer. And at step 530, a compensating layer is formed on the buffer layer.

Figure 6:
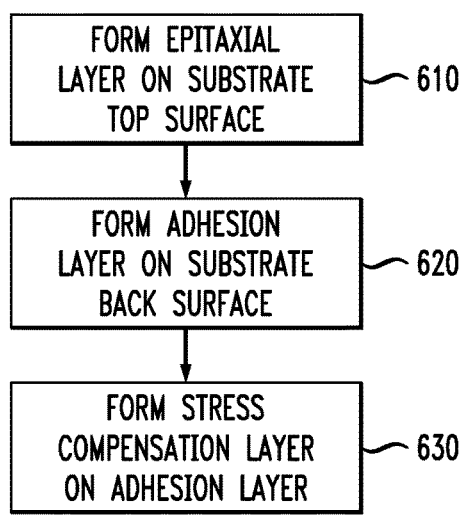
FIG. 6 is a flow chart depicting a second illustrative method for practicing the invention.

FIG. 6 is a flow chart depicting a second illustrative method for practicing the invention. At step 610, an epitaxial layer is formed on a first major surface of a semiconductor wafer. At step 620, an adhesion layer is formed on a second major surface of the semiconductor wafer. And at step 630, a high stress compensation layer is formed on the adhesion layer.

Figure 7:
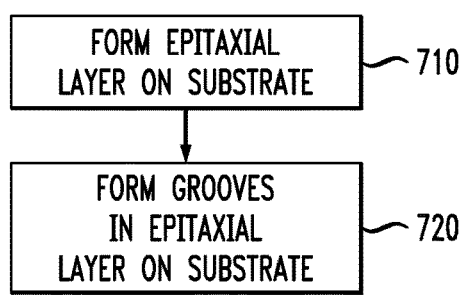
FIG. 7 is a flow chart depicting an illustrative method for practicing the invention.

FIG. 7 is a flow chart depicting an illustrative method for practicing the invention. At step 710, an epitaxial layer is formed on a first major surface of a semiconductor wafer. At step 720, grooves are formed in the epitaxial layer.

Optionally, grooves may also be formed in the surface of the epitaxial layer in the processes of FIGS. 5 and 6.

Figure 8:
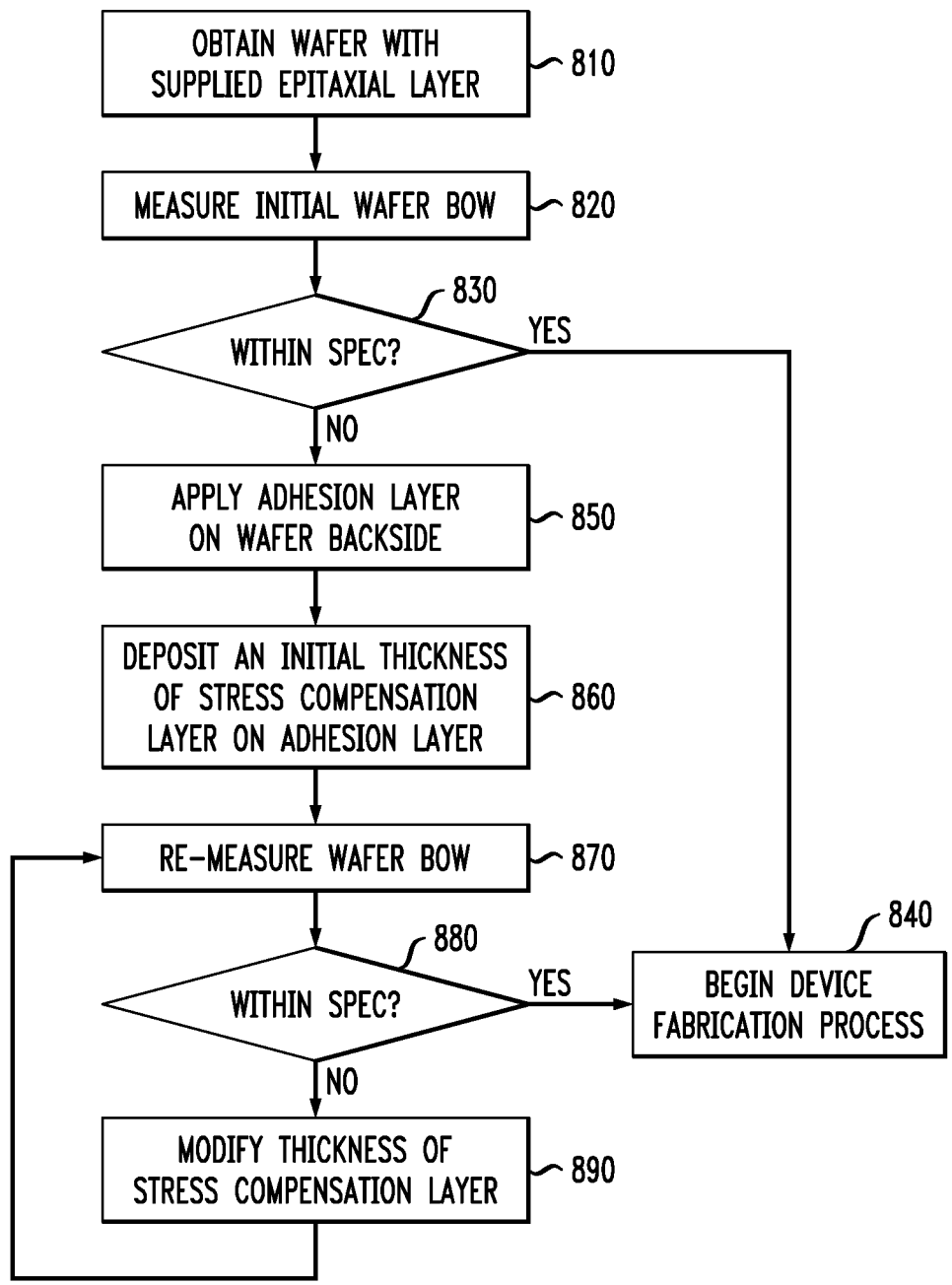
FIG. 8 is a flow chart depicting an illustrative method for practicing the invention utilizing real-time wafer bow measurements to control the deposition process of the wafer bow compensation layer.

FIG. 8 is a flow chart depicting an alternative illustrative method for practicing the invention. At step 810, a semiconductor wafer including a surface epitaxial layer is obtained. Such a wafer may be supplied by a third party vendor, or fabricated by the organization practicing the present invention. As mentioned above, the inclusion of the surface epitaxial layer may cause the wafer to bow, perhaps to a degree unacceptable for further processing. Thus, at step 820, the "as-obtained", initial wafer bow is measured. Step 830 then determines if this initial measured bow is within an acceptable limit for further processing. If so, the process moves to step 840 to begin the actual device fabrication process.

Presuming that the result of step 830 is that the initial wafer bow is too great (either tensile or compressive), the inventive process of creating a bi-layer compensation structure is used. An adhesion layer is first applied to the backside of the wafer, as shown in step 850, within an initial thickness of a stress compensation layer then deposited over the adhesion layer (step 860). Once this initial thickness is deposited, the bow of the structure is re-measured to see if this initial thickness of the stress compensation layer is sufficient (or too much) to compensate for the initial bow (this measuring indicated as step 870 in FIG. 8).

Step 880 is shown as performing this determination of bow compensation. If the initial thickness of the compensation layer is sufficient, the process proceeds to step 840 to begin the actual device fabrication process. If the result of step 880 indicates that the remaining bow is still excessive, the process proceeds to add an additional thickness to this compensation layer or, alternatively, remove a selected amount of the initial thickness if the bow has been over-compensated (shown as step 890). The process then returns to step 870 to perform another measurement of the resultant bow. Steps 870, 880, and 890 are repeated until the amount of bow in the structure is within the (relatively small) amount acceptable for further processing.

It is to be understood the bi-layer high stress compensation structure of the present invention is removed once all device processing on the front side of the wafer is completed. That is, they take the form of "sacrificial layers", serving the purpose of compensating for wafer bow during device fabrication, and no longer required once the devices are fully formed.

Optionally, wafer warpage may also be reduced by making the wafer thicker than normal. For example, in present day technologies, many wafers are formed that have a thickness on the order of approximately 675 µm. To reduce warpage, wafers may be formed that are thicker by 20 percent, 40 percent, or even more. Thus, wafers that are 1 millimeter (mm) thick may also be used to reduce warpage.

As will be apparent to those skilled in the art, numerous variations may be practiced within the spirit and scope of the present invention.

What is claimed is:

1. A method of compensating for bow in a semiconductor wafer comprising:

obtaining a semiconductor wafer including an epitaxial layer formed on a top major surface of a semiconductor substrate, the epitaxial layer causing a wafer bow across the surface of the semiconductor substrate:

applying an adhesion layer across an exposed major surface of the semiconductor wafer; and depositing a stress compensation layer over the adhesion layer, the stress compensation layer exhibiting a high stress state and formed to a thickness sufficient to substantially reduce the amount of wafer bow.

2. The method as defined in claim 1 wherein the adhesion layer is applied across an exposed major surface of the epitaxial layer.

3. The method as defined, in claim 1 wherein the adhesion layer is applied across an exposed bottom surface of the semiconductor substrate.

4. The method as defined in claim 1 wherein the adhesion layer comprises a dielectric material and is applied to a thickness no greater than 0.5 µm.

5. The method as defined in claim 4 wherein the adhesion layer dielectric material is selected from the group consisting of $SiO_2$ and SiN.

6. The method as defined in claim 1 wherein the adhesion layer comprises a metal and is applied a thickness no greater than 0.02 µm.

7. The method as defined in claim 6 wherein the adhesion layer metal is selected from the group consisting of: titanium, titanium nitride, tungsten, tantalum, aluminum and gold.

8. The method as defined in claim 1 wherein the stress compensation layer is deposited using a chemical vapor deposition process to impart a defined high stress condition within the deposited layer.

9. The method as defined in claim 8 wherein a plasma chemical or deposition (PCVD) process is used.

10. The method as defined in claim 8 wherein a plasma-enhanced chemical vapor deposition (PECVD) process is used.

11. The method as defined in claim 8 wherein a deposition process temperature is selected to be no, greater than subsequent device fabrication temperatures.

12. The method as defined in claim 1 wherein the stress compensation layer comprises a dielectric material.

13. The method as defined in claim 12 wherein the dielectric material is selected from the group consisting of: SiO2 and SiN.

14. The method as defined in claim 1 wherein the stress compensation layer comprises a metal selected from the group consisting of titanium, tungsten, nickel, aluminum, tantalum, and allows thereof.

15. The method as defined in claim 1, wherein the method includes the additional steps of prior to applying the adhesion layer, measuring an initial wafer bow exhibited by the obtained semiconductor wafer;

subsequent to depositing the stress compensation layer, measuring a resultant wafer bow remaining in the structure; and if the remaining wafer bow is above a predetermined threshold, modifying the thickness of the stress compensation layer.

16. The method as defined in claim 15, wherein the thickness of the stress compensation layer is increased to reduce the resultant wafer bow.

17. The method as defined in claim 15, wherein the thickness of the stress compensation layer is decreased to reduce the resultant wafer bow.

18. A bow-compensated semiconductor wafer comprising:

a substrate of a semiconductor material, the substrate having first and second major surfaces;

an epitaxial layer formed on the first major surface of the substrate, the combination of the substrate and the epitaxial layer creating a wafer bow across the semiconductor wafer;

an adhesion layer formed on, an exposed major surface of the semiconductor wafer; and a stress compensation layer formed on the adhesion layer, the stress compensation layer exhibiting a high stress state and formed to a thickness sufficient to reduce the created wafer bow.

19. The bow-compensated semiconductor wafer as defined in claim 18 wherein the adhesion layer comprises a metal layer formed on the second major surface of the substrate.

20. The bow-compensated semiconductor wafer as defined in claim 19 wherein the stress compensation layer comprises a PCVD dielectric layer deposited on the metal adhesion layer.

* * * * *